United States Patent
Lee et al.

(10) Patent No.: US 12,453,161 B2
(45) Date of Patent: Oct. 21, 2025

(54) SEMICONDUCTOR DEVICE WITH AIR-SPACER

(71) Applicant: Taiwan Semiconductor Manufacturing Co., Ltd., Hsin-Chu (TW)

(72) Inventors: Wei-Yang Lee, Taipei (TW); Feng-Cheng Yang, Hsinchu County (TW); Chung-Te Lin, Tainan (TW); Yen-Ming Chen, Hsin-Chu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 18/446,190

(22) Filed: Aug. 8, 2023

(65) Prior Publication Data
US 2023/0387247 A1    Nov. 30, 2023

Related U.S. Application Data

(63) Continuation of application No. 17/322,595, filed on May 17, 2021, now Pat. No. 11,830,922, which is a
(Continued)

(51) Int. Cl.
*H10D 64/66* (2025.01)
*H01L 21/02* (2006.01)
(Continued)

(52) U.S. Cl.
CPC ..... *H10D 64/679* (2025.01); *H01L 21/02068* (2013.01); *H01L 21/302* (2013.01);
(Continued)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai |

(Continued)

FOREIGN PATENT DOCUMENTS

| | | |
|---|---|---|
| CN | 103390644 A | 11/2013 |
| JP | 07161848 | 6/1995 |

(Continued)

*Primary Examiner* — Nilufa Rahim
(74) *Attorney, Agent, or Firm* — Haynes and Boone, LLP

(57) ABSTRACT

A semiconductor device includes a substrate; two source/drain (S/D) regions over the substrate; a gate stack over the substrate and between the two S/D regions; a spacer layer covering sidewalls of the gate stack; an S/D contact metal over one of the two S/D regions; a first dielectric layer covering sidewalls of the S/D contact metal; and an interlayer dielectric (ILD) layer covering the first dielectric layer, the spacer layer, and the gate stack, thereby defining a gap. A material of a first sidewall of the gap is different from materials of a top surface and a bottom surface of the gap, and a material of a second sidewall of the gap is different from the materials of the top surface and the bottom surface of the gap.

20 Claims, 11 Drawing Sheets

Related U.S. Application Data continuation of application No. 16/721,335, filed on Dec. 19, 2019, now Pat. No. 11,201,228, which is a continuation of application No. 15/623,539, filed on Jun. 15, 2017, now Pat. No. 10,522,642.

(60) Provisional application No. 62/434,336, filed on Dec. 14, 2016.

(51) Int. Cl.
    *H01L 21/302*      (2006.01)
    *H01L 21/311*      (2006.01)
    *H10D 30/01*      (2025.01)
    *H10D 62/10*      (2025.01)
    *H10D 64/01*      (2025.01)
    *H10D 64/23*      (2025.01)
    *H10D 30/69*      (2025.01)
    *H10D 62/822*      (2025.01)

(52) U.S. Cl.
    CPC ....... *H01L 21/311* (2013.01); *H10D 30/0225* (2025.01); *H10D 62/115* (2025.01); *H10D 64/015* (2025.01); *H10D 64/256* (2025.01); *H10D 64/671* (2025.01); *H10D 30/797* (2025.01); *H10D 62/822* (2025.01)

(56) References Cited

U.S. PATENT DOCUMENTS

| | | |
|---|---|---|
| 8,816,444 B2 | 8/2014 | Wann |
| 8,823,065 B2 | 9/2014 | Wang |
| 8,860,148 B2 | 10/2014 | Hu |
| 9,105,490 B2 | 8/2015 | Wang |
| 9,236,267 B2 | 1/2016 | De |
| 9,236,300 B2 | 1/2016 | Liaw |
| 9,520,482 B1 | 12/2016 | Chang |
| 9,576,814 B2 | 2/2017 | Wu |
| 9,608,065 B1 | 3/2017 | Bergendahl |
| 9,685,533 B1 | 6/2017 | Kuo |
| 9,716,158 B1 | 7/2017 | Cheng |
| 9,721,897 B1 | 8/2017 | Cheng |
| 9,728,621 B1 | 8/2017 | Cheng |
| 9,831,346 B1 * | 11/2017 | Zang ................ H01L 21/28518 |
| 2005/0037585 A1 | 2/2005 | Park |
| 2007/0202640 A1 | 8/2007 | Al-Bayati |
| 2008/0157208 A1 | 7/2008 | Fischer |
| 2012/0104512 A1 | 5/2012 | Horak |
| 2012/0168899 A1 | 7/2012 | Kim |
| 2012/0199886 A1 | 8/2012 | Horak |
| 2013/0049132 A1 | 2/2013 | Doris |
| 2013/0248950 A1 | 9/2013 | Kang |
| 2014/0138779 A1 * | 5/2014 | Xie ................ H01L 29/66553 |
| | | 257/401 |
| 2014/0264479 A1 | 9/2014 | Cai |
| 2014/0327054 A1 | 11/2014 | Adam |
| 2015/0091089 A1 | 4/2015 | Niebojewski |
| 2015/0243544 A1 | 8/2015 | Alptekin |
| 2015/0255571 A1 * | 9/2015 | Xu .................. H01L 29/4991 |
| | | 257/288 |
| 2016/0013313 A1 | 1/2016 | Cheng |
| 2016/0163816 A1 * | 6/2016 | Yu .................. H10D 64/021 |
| | | 438/283 |
| 2016/0190268 A1 * | 6/2016 | Wu .................. H01L 29/0649 |
| | | 438/257 |
| 2016/0225667 A1 * | 8/2016 | Zang ................ H01L 21/7682 |
| 2016/0365426 A1 | 12/2016 | Ching |
| 2017/0194423 A1 | 7/2017 | Lin |
| 2017/0352657 A1 | 12/2017 | Bergendahl |
| 2018/0006128 A1 | 1/2018 | Cheng |
| 2018/0076199 A1 | 3/2018 | Wang |
| 2018/0082951 A1 | 3/2018 | Li |
| 2018/0166319 A1 | 6/2018 | Park |
| 2023/0411489 A1 * | 12/2023 | Zhang ............. H01L 21/76826 |

FOREIGN PATENT DOCUMENTS

| | | |
|---|---|---|
| JP | 10335646 | 12/1998 |
| KR | 20010011638 A | 2/2001 |

\* cited by examiner

SEMICONDUCTOR DEVICE WITH AIR-SPACER

PRIORITY

This application is a continuation of U.S. patent application Ser. No. 17/322,595 filed May 17, 2021, which is a continuation of U.S. patent application Ser. No. 16/721,335, filed Dec. 19, 2019 and issued as U.S. Pat. No. 11,201,228, which is a continuation application of U.S. patent application Ser. No. 15/623,539, filed Jun. 15, 2017, issued as U.S. Pat. No. 10,522,642, which claims the benefits of U.S. Prov. App. No. 62/434,336, filed Dec. 14, 2016, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, it is generally desired to reduce stray capacitance among features of field effect transistors, such as capacitance between a gate structure and source/drain contacts, in order to increase switching speed, decrease switching power consumption, and/or decrease coupling noise of the transistors. Certain low-k materials, with a dielectric constant lower than that of silicon oxide, have been suggested as insulator materials providing lower relative permittivity to reduce stray capacitance. However, as semiconductor technology progresses to smaller geometries, the distances between the gate structure and source/drain contacts are further reduced, resulting in still large stray capacitance. Therefore, although existing approaches in transistor formation have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
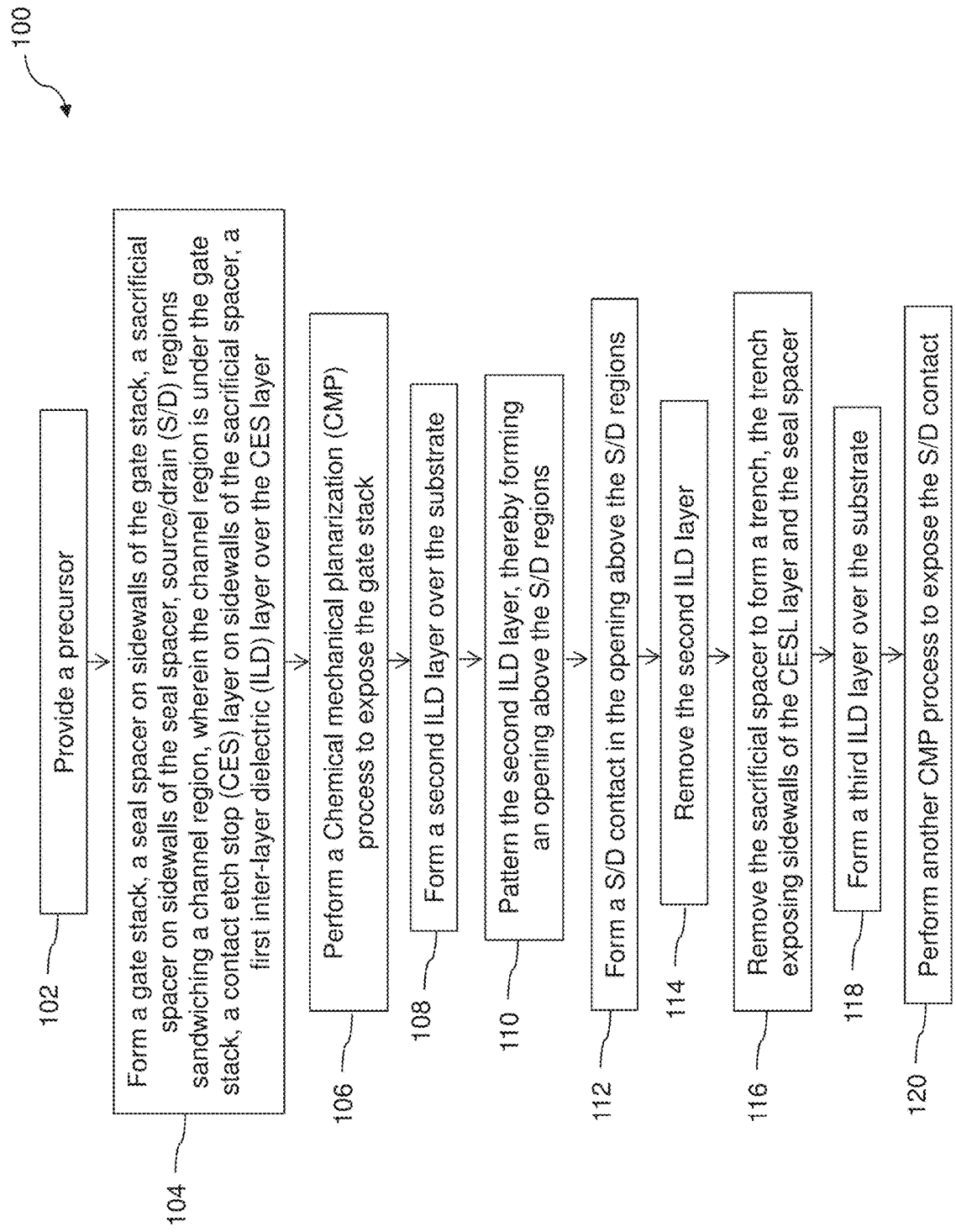
FIG. 1 is a flow chart of a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. More particularly, the present disclosure is related to providing methods and structures for lowering stray capacitance between a gate structure and source/drain contacts of field effect transistors (FETs) in semiconductor manufacturing. In the forming of FETs, it is desired to increase switching speed, decrease switching power consumption, and decrease coupling noise. Stray capacitance generally has a negative impact on these parameters, especially from stray capacitance between a gate structure and source/drain contacts. As semiconductor technology progresses to smaller geometries, the distances between the gate and source/drain contacts shrink, resulting in larger stray capacitance. Consequently, stray capacitance in FETs has become more problematic. The present disclosure provides solutions in forming air-spacers surrounding gate structures instead of spacers conventionally made of a solid dielectric material, lowering the relative permittivity (or dielectric constant) between the gate and source/drain contacts and thereby lowering stray capacitance.

FIG. 1 illustrates a flow chart of a method 100 for forming semiconductor devices according to the present disclosure. The method 100 is an example, and is not intended to limit the present disclosure beyond what is explicitly recited in the claims. Additional operations can be provided before, during, and after the method 100, and some operations described can be replaced, eliminated, or relocated for additional embodiments of the method. The method 100 is described below in conjunction with FIGS. 2-9, which illustrate cross-sectional views of a semiconductor device 200 during various fabrication steps according to an embodiment of the method 100. The device 200 may be an intermediate device fabricated during processing of an integrated circuit (IC), or a portion thereof, that may comprise static random access memory (SRAM) and/or logic circuits, passive components such as resistors, capacitors, and inductors, and active components such as p-type FETs (pFETs), n-type FETs (nFETs), FinFETs, metal-oxide semiconductor field effect transistors (MOSFET), and complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

Figure 2A:
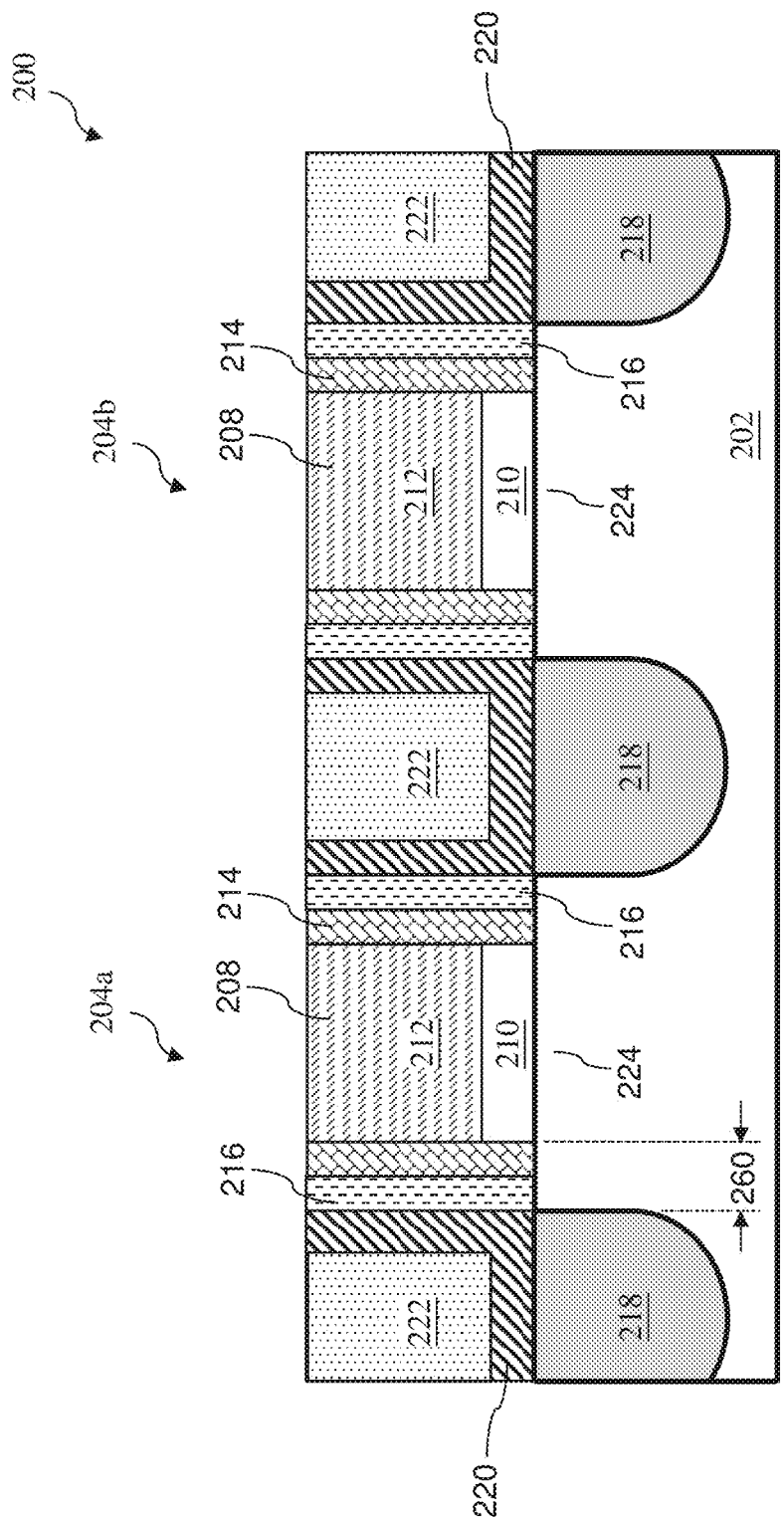
FIGS. 2A, 2B, 3, 4, 5, 6, 7, 8A, 8B, and 9 are cross-sectional views of a portion of a semiconductor device constructed according to the method in FIG. 1, in accordance with some embodiments.

At operation 102, the method 100 (FIG. 1) provides a precursor of the device 200 (FIG. 2A). For the convenience of discussion, the precursor of the device 200 is also referred to as the device 200. The device 200 may include a substrate 202 and various features formed therein or thereon. The substrate 202 is a silicon substrate in the present embodiment. Alternatively, the substrate 202 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor on insulator (SOI).

In some embodiments, the substrate 202 includes an insulator (or an isolation structure) that may be formed of silicon oxide, silicon nitride, silicon oxynitride, fluoride-doped silicate glass (FSG), a low-k dielectric material, and/or other suitable insulating material. The insulator may be shallow trench isolation (STI) features. In an embodiment, the insulator is formed by etching trenches in the substrate 202, filling the trenches with an insulating material, and performing a chemical mechanical planarization (CMP) process to the substrate 202 including the insulating material. The substrate 202 may include other isolation structure(s) such as field oxide and LOCal Oxidation of Silicon (LOCOS). The substrate 202 may include a multi-layer isolation structure.

At operation 104, the method 100 (FIG. 1) forms one or more FETs 204 (e.g., FETs 204a and 204b) on the substrate 202 (FIG. 2A). The FETs 204 may include n-type FETs, p-type FETs, or a combination thereof. In some embodiments, FETs 204a and 204b are both n-type FETs or are both p-type FETs. In alternative embodiments, FET 204a is an n-type FET and FET 204b is a p-type FET.

Each FET 204 includes a gate stack 208. The gate stack 208 is disposed over the substrate 202. In various embodiments, the gate stack 208 is a multi-layer structure. The gate stack 208 may include a gate dielectric layer 210 and a gate electrode layer 212. In some embodiments, the gate dielectric layer 210 further includes a high-k dielectric layer and an interfacial layer interposed between the substrate 202 and the high-k dielectric layer. In various embodiments, the interfacial layer may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods. The high-k dielectric layer is formed by a suitable process such as an atomic layer deposition (ALD). Other methods to form the high-k dielectric layer include metal organic chemical vapor deposition (MOCVD), physical vapor deposition (PVD), UV-Ozone Oxidation and molecular beam epitaxy (MBE). In one embodiment, the high-k dielectric material includes hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. Alternatively, the high-k dielectric layer includes metal nitrides or metal silicates.

In some embodiments, the gate electrode layer 212 may be a poly-silicon layer or a metal gate electrode layer. The metal gate electrode layer may further include multiple layers, such as a work function metal layer and a metal fill layer. The work function metal layer may include a p-type work function metal layer or an n-type work function metal layer. The p-type work function metal layer comprises a metal selected from, but not limited to, the group of titanium nitride (TiN), tantalum nitride (TaN), ruthenium (Ru), molybdenum (Mo), tungsten (W), platinum (Pt), or combinations thereof. The n-type work function metal layer comprises a metal selected from, but not limited to, the group of titanium (Ti), aluminum (Al), tantalum carbide (TaC), tantalum carbonitride (TaCN), tantalum silicon nitride (TaSiN), or combinations thereof. The p-type or n-type work function metal layer may further include a plurality of layers and may be deposited by CVD, PVD, and/or other suitable process. The one or more metal layers may include aluminum (Al), tungsten (W), cobalt (Co), copper (Cu), and/or other suitable materials, and may be formed by CVD, PVD, plating, and/or other suitable processes. The metal fill layer may include aluminum (Al), tungsten (W), or copper (Cu) and/or other suitable materials. The metal fill layer may be formed by CVD, PVD, plating, and/or other suitable processes.

A gate spacer is formed on sidewalls of each gate stack 208. Referring to FIG. 2A, in various embodiments, the gate spacer may include multiple layers such as a seal spacer 214 and a dummy spacer 216. The seal spacer 214 includes a dielectric material, such as silicon oxide ($SiO_2$), silicon nitride (SiN), silicon oxynitride (SiON), silicon carbonitride (SiCN), silicon carbon oxynitride (SiCON), other dielectric material, or combination thereof. The seal spacer 214 protects the four approximately vertical sides of the gate stack 208. The dummy spacer 216 may compose of silicon oxide ($SiO_2$), aluminum oxide (AlO), silicon nitride (SiN), silicon oxynitride (SiON), silicon carbonitride (SiCN), silicon carbon oxynitride (SiCON). Generally, the composition of the seal spacer 214 and the dummy spacer 216 are selected such that the seal spacer 214 has a high etch selectivity as compared to the dummy spacer 216. The dummy spacer 216 will be removed in subsequent operations of the method 100 to form a void as an air-spacer, while the seal spacer 214 is substantially remained. Therefore, the dummy spacer 216 is also referred to as the sacrificial spacer 216. The forming of the air-spacer will be further described in details later. In an example, the seal spacer 214 is formed by blanket depositing a dielectric layer (e.g., a silicon nitride layer having a substantially uniform thickness) over the device 200 by a CVD process and then anisotropically etching to remove portions of the dielectric layer to form the seal spacer 214. The sacrificial spacer 216 may be formed with a similar process. In some embodiments, the sacrificial spacer 216 has a thickness in a range from about 2 nm to about 4 nm.

The source/drain (S/D) regions 218 are also formed in the substrate 202. The S/D regions 218 may be n-type doped regions and/or p-type doped regions for forming active devices. The S/D regions 218 may include heavily doped S/D (HDD), lightly doped S/D (LDD), raised regions, strained regions, epitaxially grown regions, and/or other suitable features. The S/D regions 218 may be formed by etching and epitaxial growth, S/D implantation, S/D activation, and/or other suitable processes. In an embodiment, the S/D regions 218 further include silicidation or germanosilicidation. For example, silicidation may be formed by a process that includes depositing a metal layer, annealing the metal layer such that the metal layer is able to react with silicon to form silicide, and then removing the non-reacted metal layer. In an embodiment, the device 200 includes fin-like active regions for forming multi-gate FETs such as FinFETs. To further this embodiment, the S/D regions 218 and the channel region 224 may be formed in or on the fins. The channel region 224 is under the gate stack 208 and interposed between a pair of S/D regions 218. The channel region 224 conducts currents between the respective S/D regions 218 when the semiconductor device 200 turns on, such as by biasing the gate electrode layer 212.

Figure 2B:
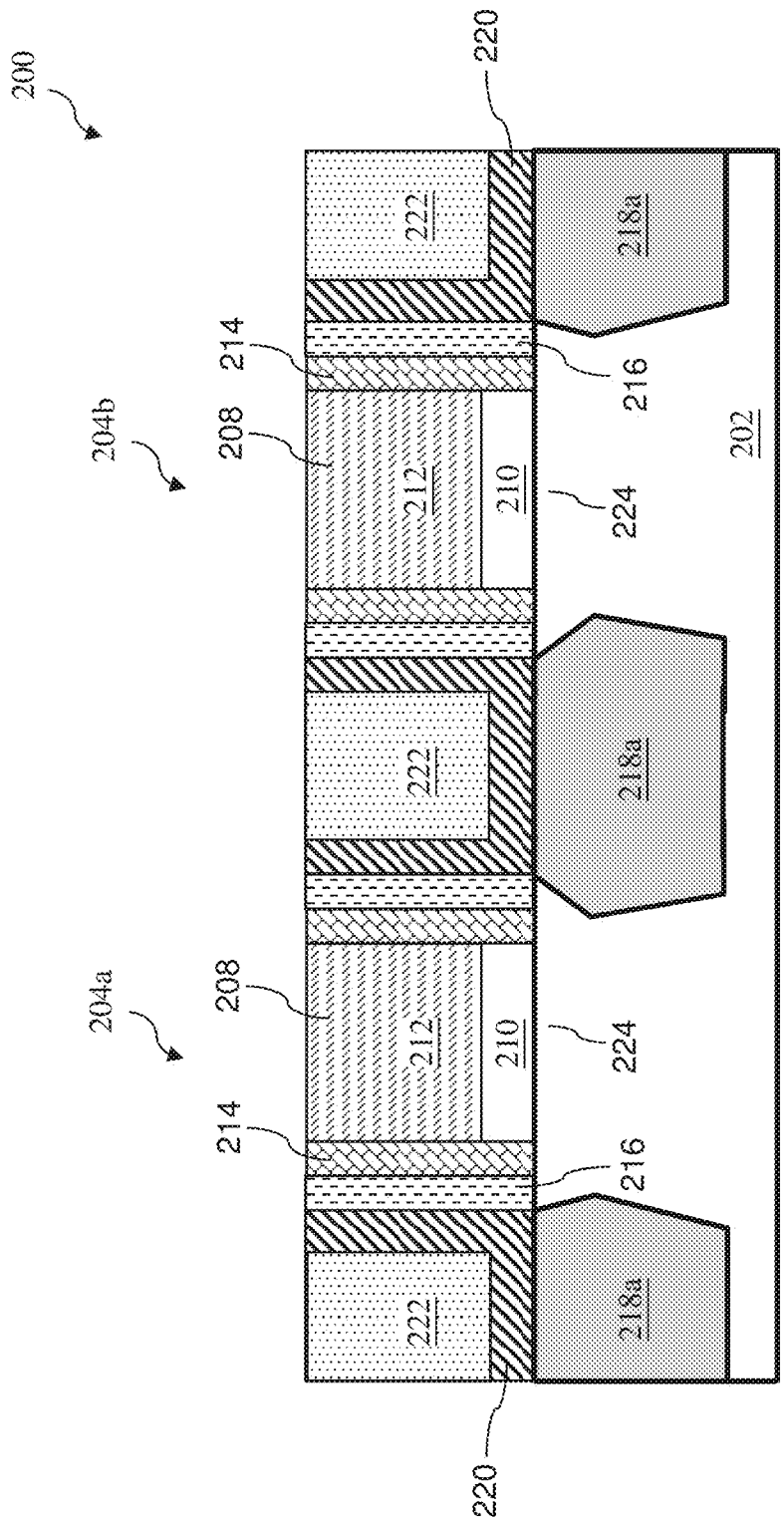

Still referring to FIG. 2A, in the present embodiment, the S/D regions 218 are formed by first etching S/D recesses in the substrate 202 followed by epitaxially growing S/D regions 218 in the respective recesses. Based on the profile of the S/D recesses, the S/D regions 218 may have a substantially u-shaped profile and a sidewall of each of the S/D regions 218 is substantially aligned with the edge (or outer boundary) of the sacrificial spacer 216. The respective sidewall is spaced from the gate stack 208 by a distance 260. In some embodiments, the distance 260 is in a range from about 2 nm to about 10 nm. In some embodiment where the spacers 214/216 are thicker than desired which enlarges the distance 260 and it is desired that the distance 260 falls nonetheless into a shorter range, the S/D regions 218 can be formed to have a substantially diamond-shaped profile, such as S/D regions 218a in FIG. 2B. Referring to FIG. 2B, some sidewalls of the S/D regions 218a are extended towards the gate stack 208 underneath the spacers 214/216. In one example, the S/D recesses are formed with an etching process that includes both a dry etching and a wet etching process where etching parameters thereof are tuned (such as etchants used, etching temperature, etching solution concentration, etching pressure, source power, radio frequency (RF) bias voltage, RF bias power, etchant flow rate, and other suitable parameters) to achieve the desired recesses profile. For the convenience of discussion, the device 200 with the S/D regions in a shape as shown in FIG. 2A is used as an example for subsequent operations. Persons having ordinary skill in the art should recognize that the device 200 with the S/D regions in a shape as shown in FIG. 2B can also be used for the subsequent operations.

Referring back to FIG. 2A, in the present embodiment, the device 200 includes a contact etch stop (CES) layer 220 over the substrate 202 and on sidewalls of the sacrificial spacer 216, and further includes an inter-layer dielectric (ILD) layer 222 over the CES layer 220. The CES layer 220 may include a dielectric material such as silicon nitride (SiN), silicon oxide (SiO2), silicon oxynitride (SiON), silicon carbonitride (SiCN), silicon carbon oxynitride (SiCON), other dielectric materials, or combination thereof. The CES layer 220 may be formed by a plasma-enhanced CVD (PECVD) process and/or other suitable deposition or oxidation processes. The ILD layer 222 may include materials such as or silicon oxide, doped silicon oxide such as borophosphosilicate glass (BPSG), tetraethylorthosilicate (TEOS) oxide, un-doped silicate glass, fused silica glass (FSG), phosphosilicate glass (PSG), boron doped silicon glass (BSG), low-k dielectric material, and/or other suitable dielectric materials. The ILD layer 222 may be deposited by a PECVD process, a flowable CVD (FCVD) process, or other suitable deposition technique. The composition of the CES layer 220 and the ILD layer 222 are selected such that the CES layer 220 has some etch selectivity as compared to the ILD layer 222. In an embodiment, the CES layer 220 is deposited as a blanket layer over the substrate 202 covering various structures thereon, and the ILD layer 222 is deposited over the CES layer 220. Subsequently, the method 100 (FIG. 1) proceeds to operation 106 by performing a chemical mechanical planarization (CMP) process to polish the ILD layer 222 and expose the gate stack 208 (FIG. 2A). As a result, portions of the CES layer 220 remain over the substrate 202 between adjacent sacrificial spacers 216.

Figure 3:
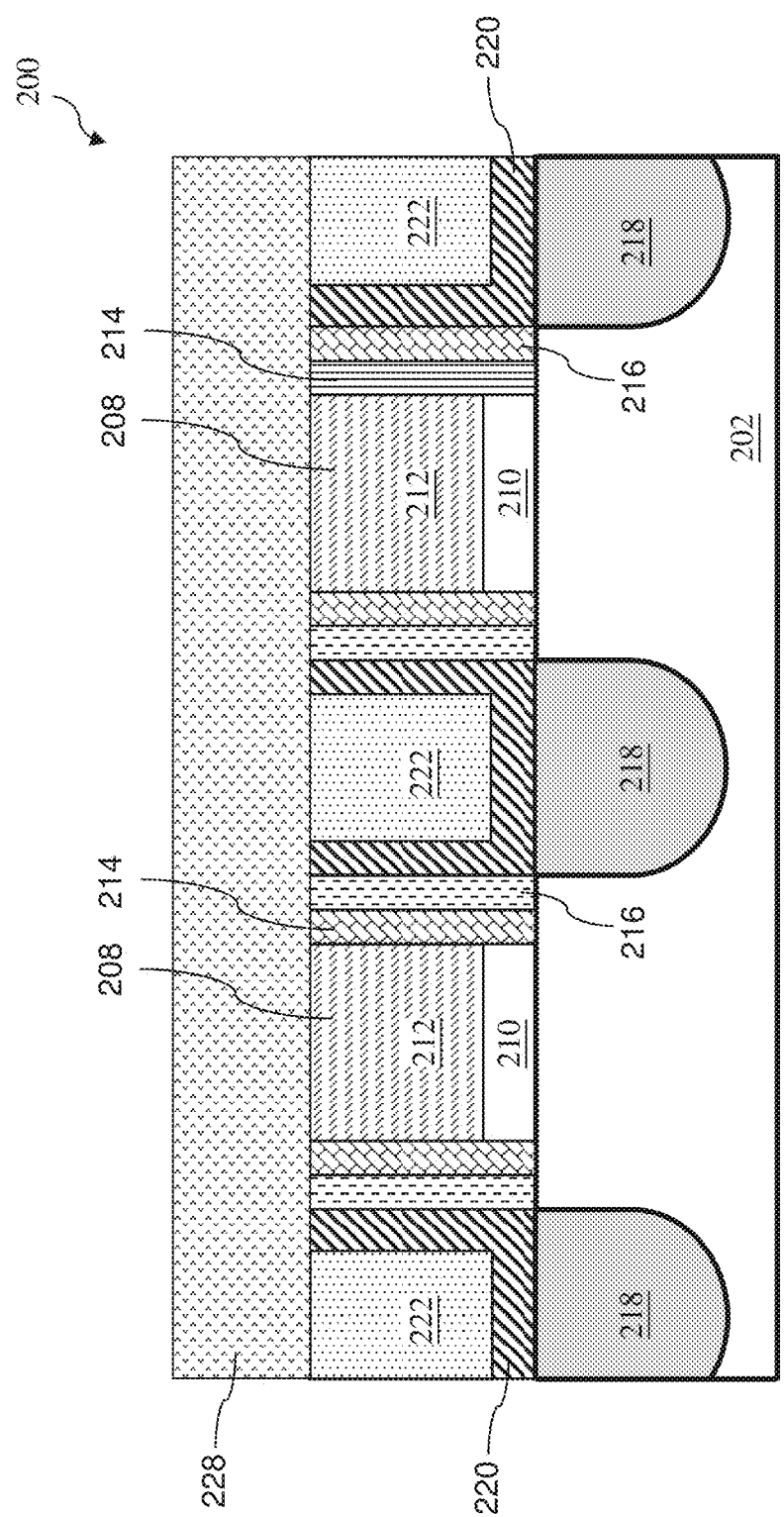

At operation 108, the method 100 (FIG. 1) forms another ILD layer 228 over the device 200 (FIG. 3). The ILD layer 228 may include silicon oxide, low-k dielectric material, or other suitable dielectric material, formed by CVD or other suitable method. For example, the ILD layer 228 may be formed by a PECVD process, a FCVD process, or other suitable deposition processes. In some embodiments, the ILD layer 228 may include different or same material as the ILD layer 222. A CMP process may follow operation 108 to remove excessive dielectric materials.

Figure 4:
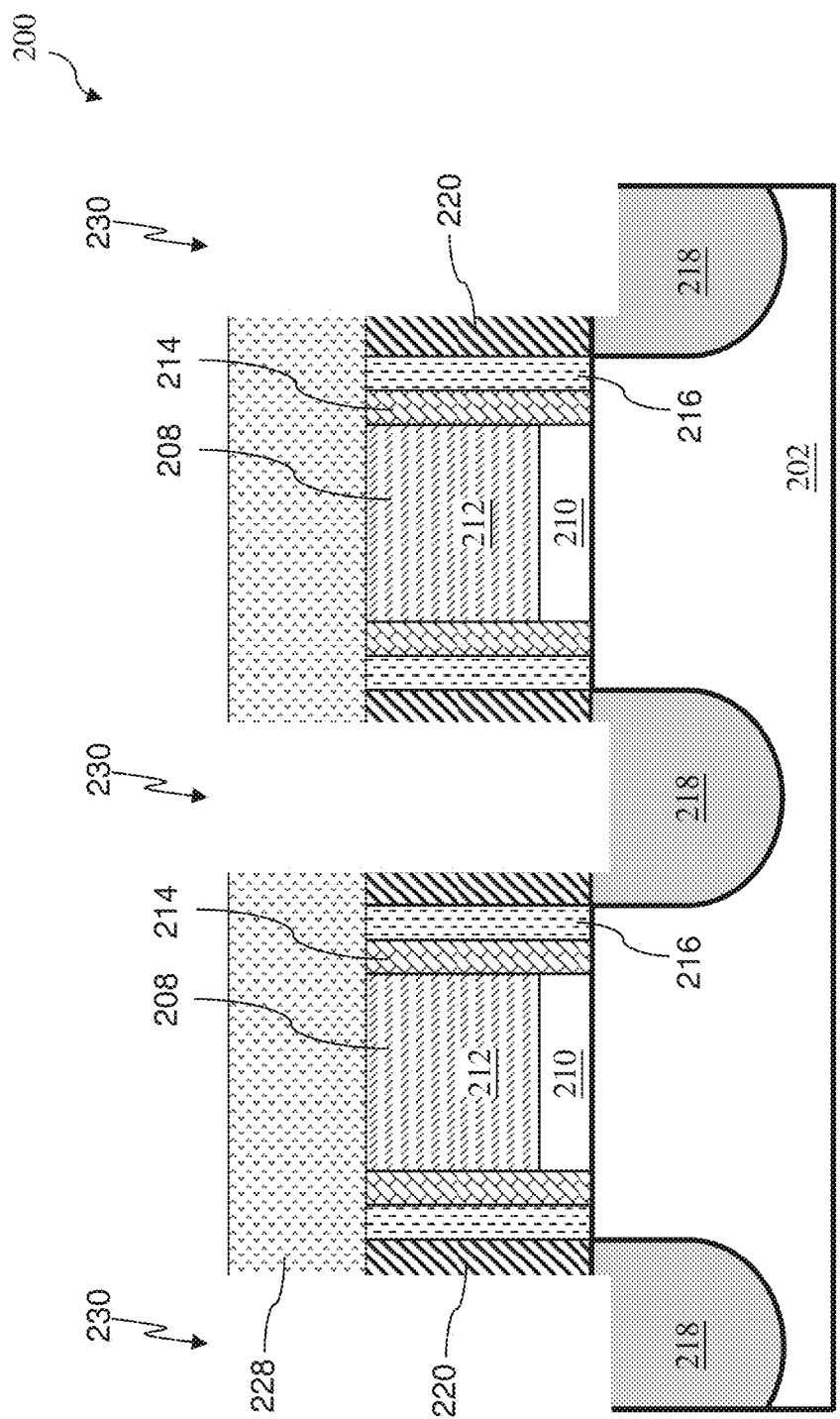

At operation 110, the method 100 (FIG. 1) patterns the ILD layer 228 to form the S/D via holes 230 over the S/D regions 218 (FIG. 4). In an embodiment, operation 110 includes a photolithography process and etching processes. The photolithography process may include forming a photoresist (or resist) over the ILD layer 228, exposing the resist to a pattern that defines various geometrical shapes for the S/D via holes 230, performing post-exposure bake processes, and developing the resist to form a masking element including the resist. The masking element, or a derivative thereof, is then used for etching recesses into the ILD layer 228. The masking element (e.g., a patterned resist) is subsequently removed. The etching processes may include one or more dry etching processes, wet etching processes, and other suitable etching techniques. For example, the etching processes may include a two-step etching. The first etching step removes portions of the ILD layers 228 and 222 to expose a bottom portion of the CES layer 220, and the second etching step removes the bottom portion of the CES layer 220, thereby exposing a portion of the S/D regions 218. In some embodiments, the ILD layer 222 is substantially completely removed in the operation 11.

Figure 5:
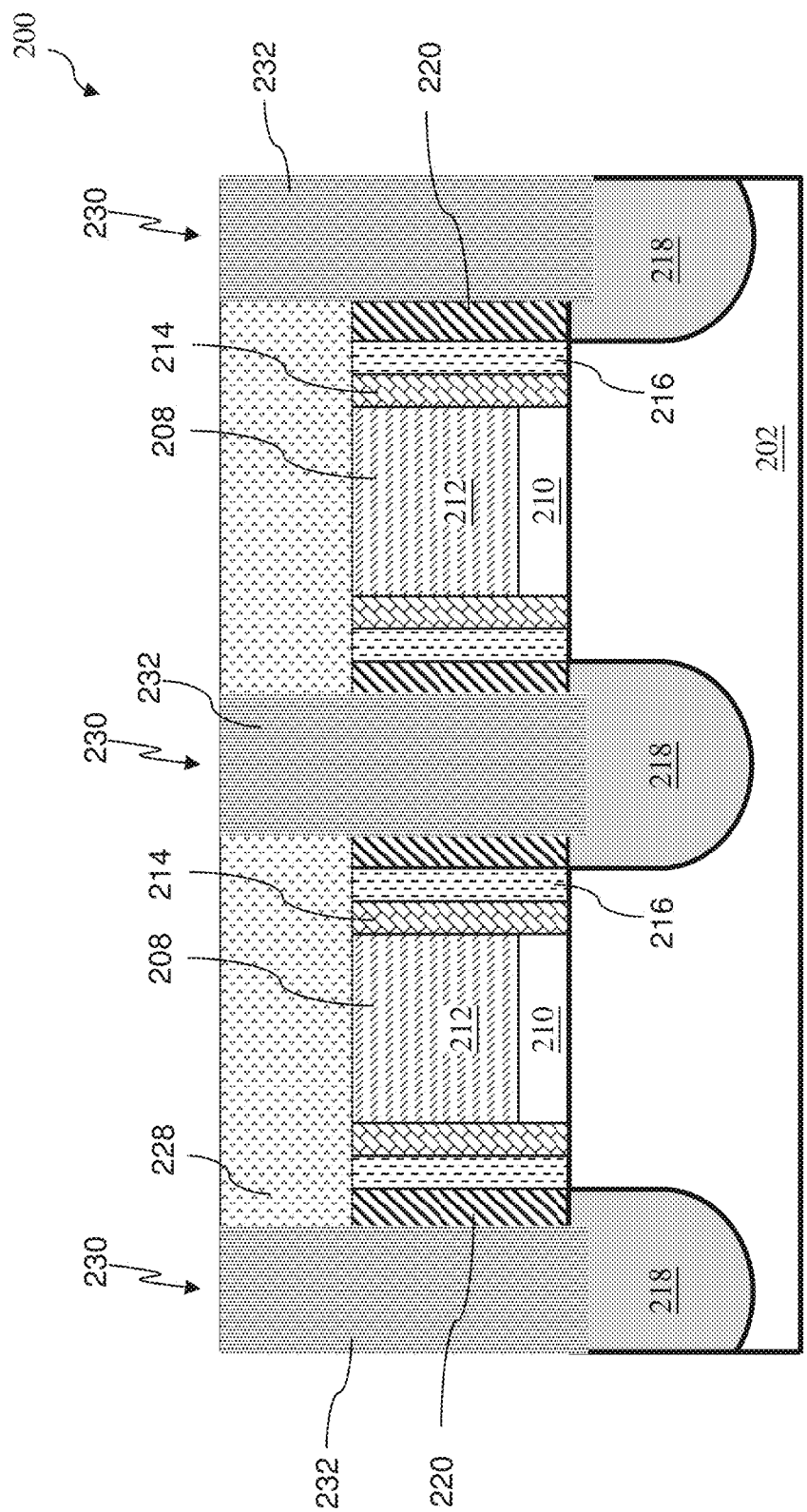

At operation 112, the method 100 (FIG. 1) form one or more S/D contacts 232 in the S/D via holes 230 (FIG. 5). In an embodiment, the S/D contacts 232 include a metal such as tungsten (W), aluminum (Al), copper (Cu), combinations thereof, or other suitable conductive material. In an embodiment, the contact metal is deposited using a suitable process, such as CVD, PVD, plating, and/or other suitable processes. A CMP process may follow operation 112 to remove excessive metals.

Figure 6:
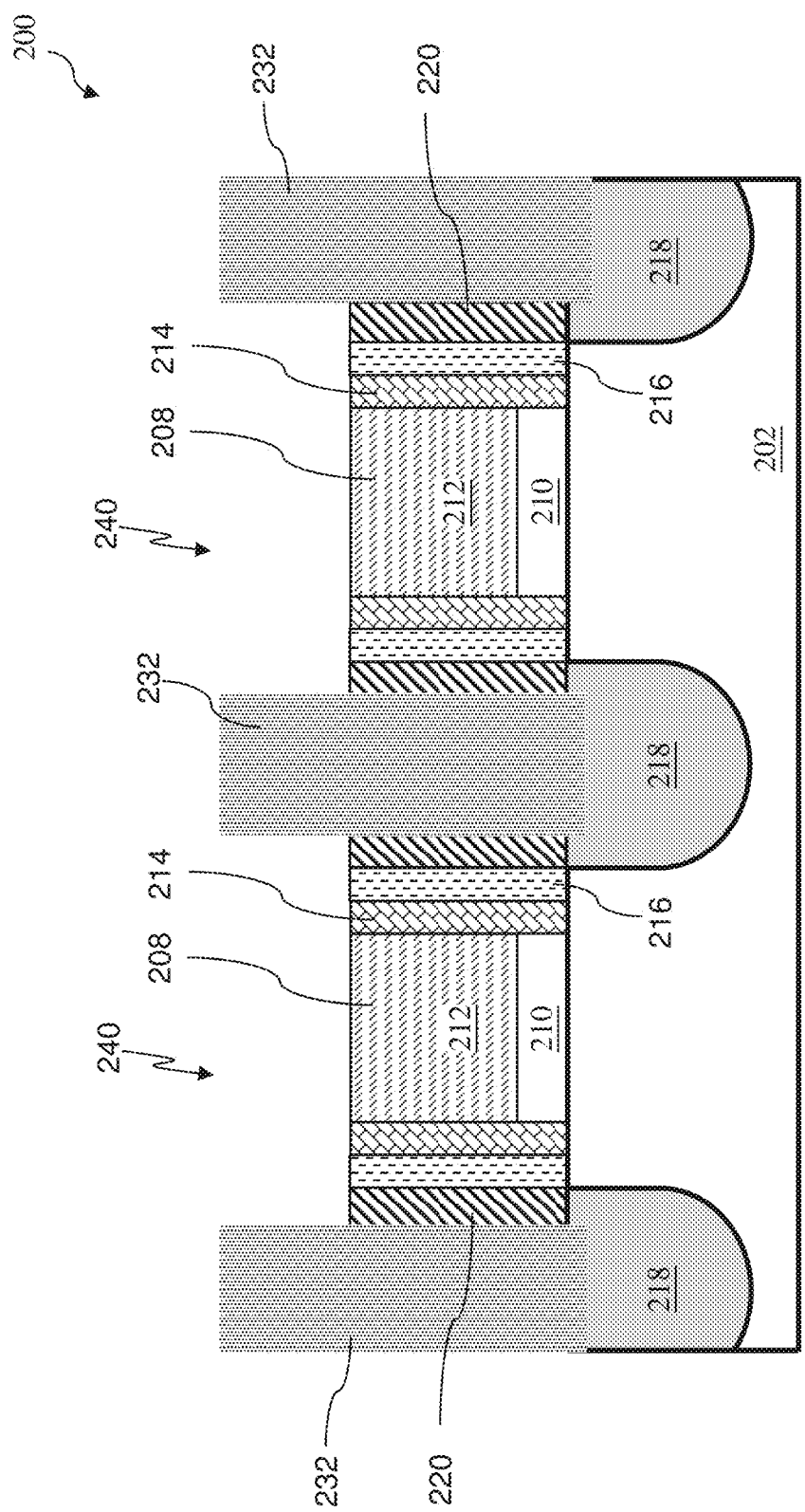

At operation 114, the ILD layer 228 is removed, forming openings 240 that expose layers 214, 216, 220, and the gate stack 208, as shown in FIG. 6. In an embodiment, the operation 114 includes an etching process that is tuned to etch the ILD layer 228 while the other layers, 214, 216, 220, and the gate stack 208, remain substantially unchanged in the etching process. In embodiments, the operation 114 may use a dry etching, a wet etching, or other suitable etching processes.

Figure 7:
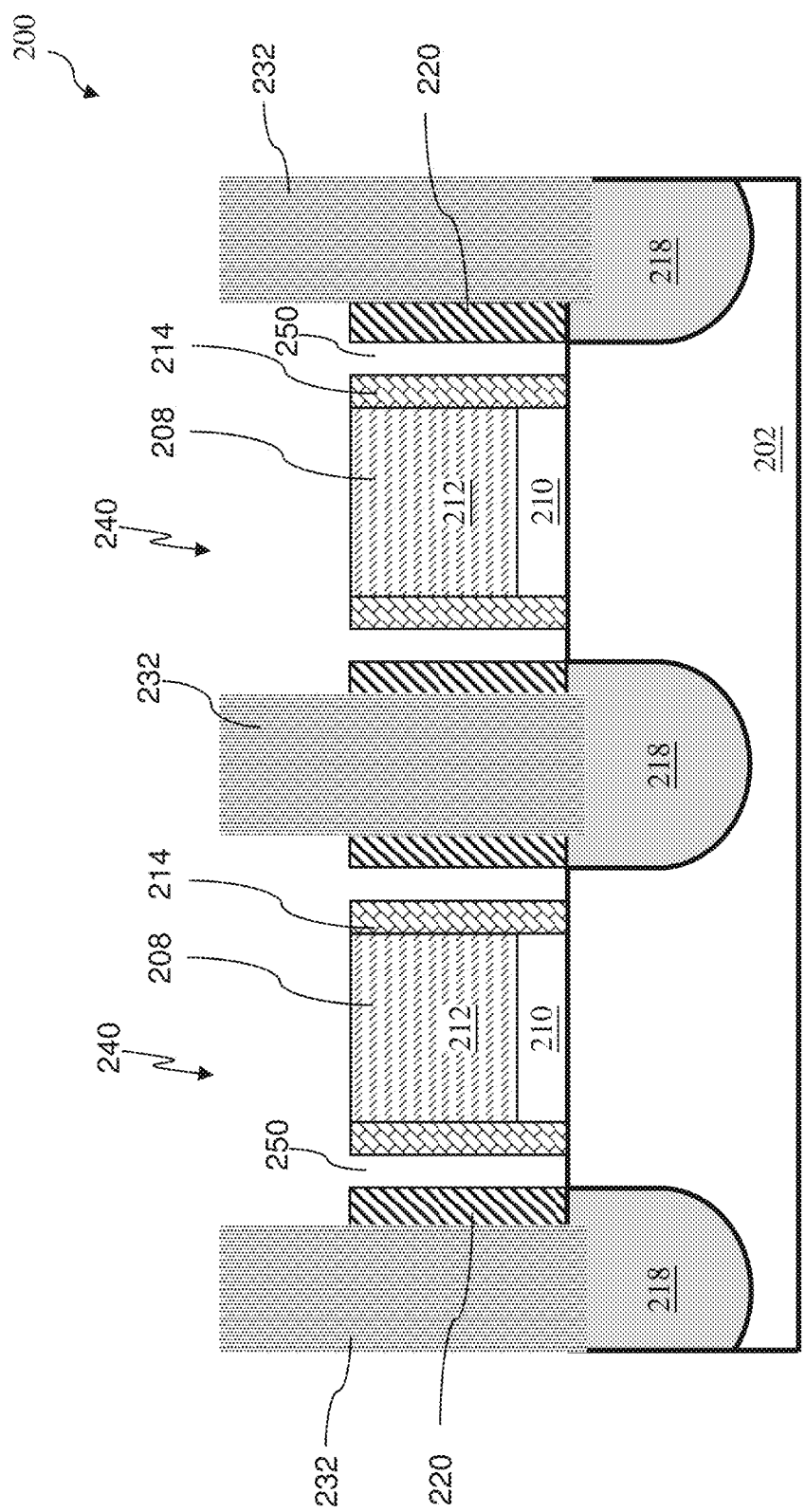

The method 100 (FIG. 1) proceeds to operation 116 where trench 250 for creating the air-spacer structure is formed (FIG. 7). Specifically the trench 250 is formed by etching the sacrificial spacer 216. In an embodiment, the trench 250 is filled with air, forming an air gap between the seal spacer 214 and the CES layer 220. The sidewalls of the seal spacer 214 and the CES layer 220 are exposed in the trench 250.

Generally, the composition of the seal spacer 214 and the CES layer 220 are selected such that the seal spacer 214 and the CES layer 220 has a high etch selectivity as compared to the sacrificial spacer 216. As a result, the etching process may remove the sacrificial spacer 216 while the seal spacer 214 and the CES layer 220 remain relatively and/or substantially unchanged in thickness. In some embodiments, the seal spacer 214 and the CES layer 220 contains nitride (or nitride rich) and the sacrificial spacer contains oxide (or oxide rich). For example, each of the seal spacer 214 and the CES layer 220 may contain a composition selected from a group of silicon nitride, silicon carbonitride, silicon oxynitride, silicon carbon oxynitride (tuned to be nitride rich), and a combination thereof, while the sacrificial spacer 216 may contain a composition selected from a group of silicon oxide, aluminum oxide, silicon carbon oxynitride (tuned to be oxide rich), and a combination thereof. The seal spacer 214 and the CES layer 220 may contain the same or different materials. In one specific embodiment, the seal spacer 214 contains silicon nitride, the CES layer 220 contains silicon carbonitride, and the sacrificial spacer 216 contains aluminum oxide. In another specific embodiment, the seal spacer 214 contains silicon carbonitride, the CES layer 220 contains silicon carbon oxynitride, and the sacrificial spacer 216 contains aluminum oxide. In alternative embodiments, the seal spacer 214 and the CES layer 220 contains oxide (or oxide rich) and the sacrificial spacer 216 contains nitride (or nitride rich). For example, each of the seal spacer 214 and the CES layer 220 may contain a composition selected from a group of silicon oxide, aluminum oxide, silicon carbon oxynitride (tuned to be oxide rich), and a combination thereof, while the sacrificial spacer 216 may contain a composition selected from a group of silicon nitride, silicon carbonitride, silicon oxynitride, silicon carbon oxynitride (tuned to be nitride rich), and a combination thereof. In yet another specific embodiment, the seal spacer 214 contains silicon oxide, the CES layer 220 contains silicon carbon oxynitride, and the sacrificial spacer 216 contains silicon nitride.

In embodiments, the operation 116 uses an etching process with an etchant to selectively remove the sacrificial spacer 216. The operation 116 may use a dry etching, a wet etching, or other suitable etching processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. In one example, the sacrificial spacer 216 contains silicon oxide and the wet etching process includes applying DHF. In another example, the sacrificial spacer 216 contains aluminum oxide and the wet etching process includes applying an ammonia and hydrogen peroxide mixture (APM) such as an SC1 solution ($NH_4OH:H_2O_2:H_2O$). In yet another example, the sacrificial spacer 216 contains silicon nitride and the wet etching process includes applying an acid containing $H_3PO_4$.

Figure 8A:
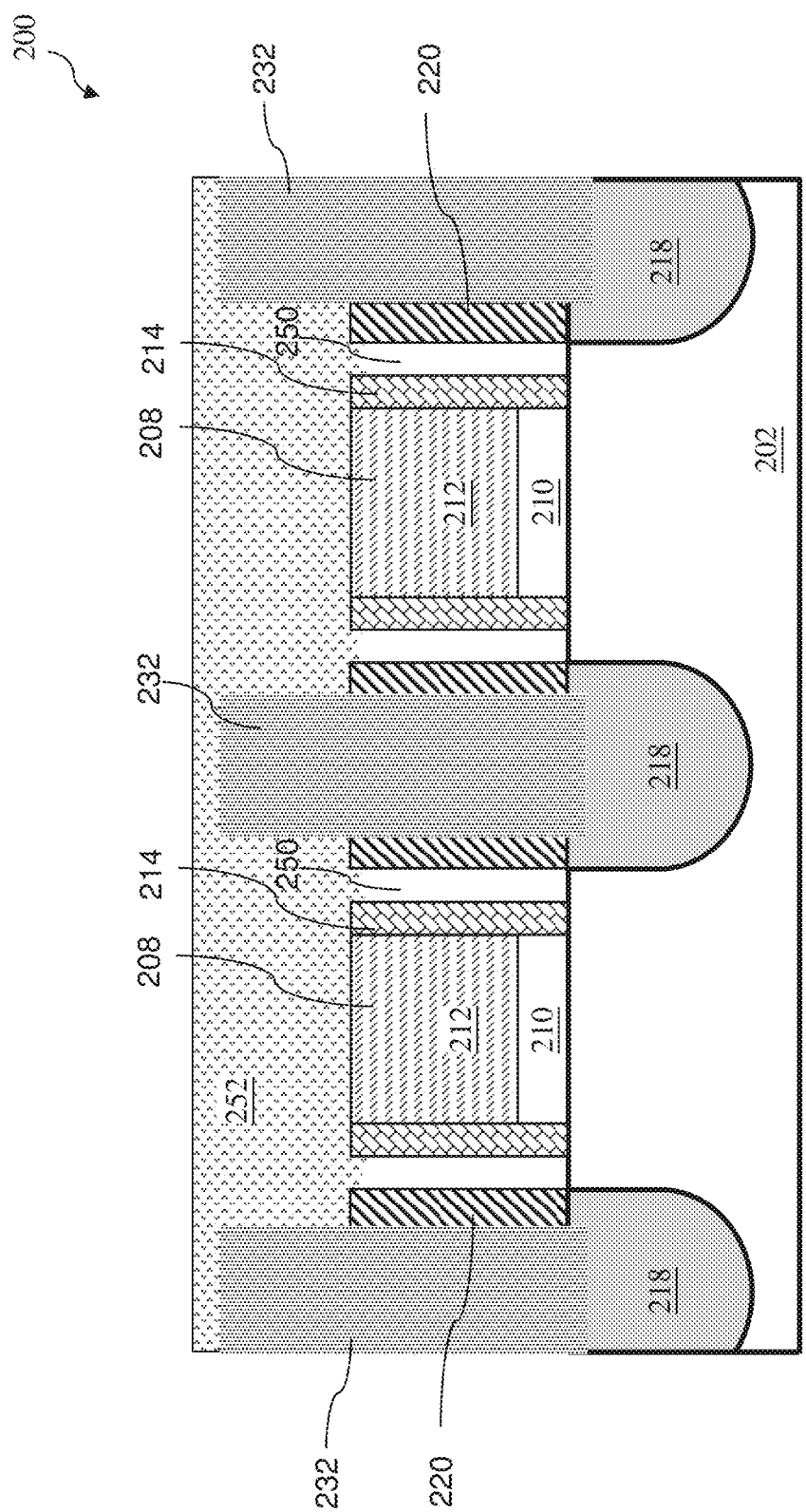

The method 100 (FIG. 1) proceeds to operation 118 where a cap structure for the air gap (void) is formed above the trench 250. Specifically, an ILD layer 252 is deposited above the device 200, as shown in FIG. 8A. The ILD layer 252 also forms a cap or upper wall for the air gap in the trench 250. In an embodiment, the ILD layer 252 is formed by chemical vapor deposition (CVD), physical vapor deposition (PVD), coating process, and/or other suitable process. In an embodiment, the ILD layer 252 is deposited by a CVD process. The formation of the ILD layer 252 is tuned to effectively close up the trench 250, resulting in the air gap. The parameters in the CVD process (e.g., pressure, temperature, and gas viscosity) are tuned in a way such that the gap fill behavior of depositing dielectric materials maintains the air gap without filling up the trench 250. In the present embodiment, the CVD process employs a setting with pressure less than about 0.75 torr and temperature higher than about 75 degree Celsius. Hence, the dielectric material of the ILD layer 252 may be deposited at the upper portion of the trench 250 to enclose the opening of the trench 250 without a significant amount being deposited in a lower portion of the trench 250. Respective air gap can therefore be formed below the dielectric material of the ILD layer 252 and between the seal spacer 214 and the CES layer 220. The sidewalls of the seal spacer 214 and the CES layer 220 are exposed in the air gap. A gas, such as a gas(es) used during the deposition of the dielectric material of the ILD layer 252 or any other species that can diffuse into the air gap, may be in the air gap. The ILD layer 252 extends laterally from the air gap to top surfaces of the seal spacer 214 and the gate stack 208. The ILd layer 252 also covers the CES layer 220 and the S/D contacts 232. In some embodiments, the ILD layer 252 may include silicon nitride, silicon oxynitride, silicon carbonitride. In some embodiments, the ILD layer 252 may include an oxide, such as TEOS, BPSG, FSG, PSG, and BSG. The ILD layer 252 may include different or same material as the ILD layer 228. In the present embodiment, the ILD layer 252 is a silicon oxide layer.

Figure 8B:
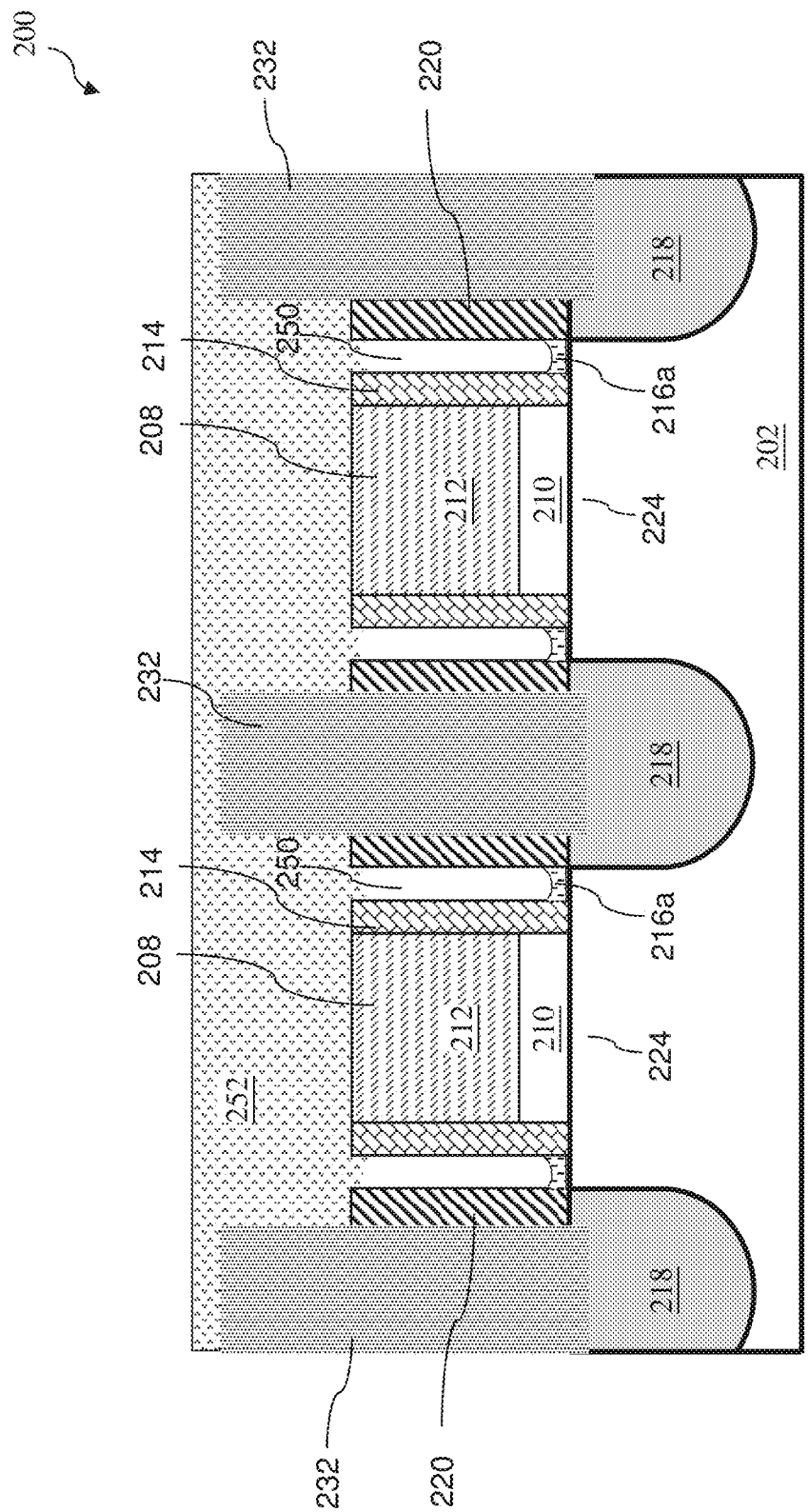

Still referring to FIG. 8A, in some embodiments, substrate 202 is exposed in the trench 250 after the etching of the sacrificial layer 216. Therefore, the air gap defined in the trench 250 spans horizontally from a sidewall of the spacer layer 214 to a sidewall of the CES layer 220, and spans vertically from a top surface of the substrate 202 to a bottom surface of the ILD layer 252. In alternative embodiments, the sacrificially layer 216 may not be completely removed from the trench 250 in the etching process (e.g., by controlling the etching time) and have some residue 216a remained in the bottom of the trench 250, which still covers the substrate 202, as shown in FIG. 8B. In this case, the air gap spans vertically from a bottom portion of the sacrificial layer 216 to a bottom surface of the ILD layer 252, instead. In the present embodiment, the air gap has a width in a range from about 2 nm to about 4 nm. The air gap forms air-spacer structures surrounding the gate stack 208, which helps reducing the effective dielectric constant of material layers between the gate stack 208 and the S/D contacts 232 and thereby reducing respective stray capacitance.

Figure 9:
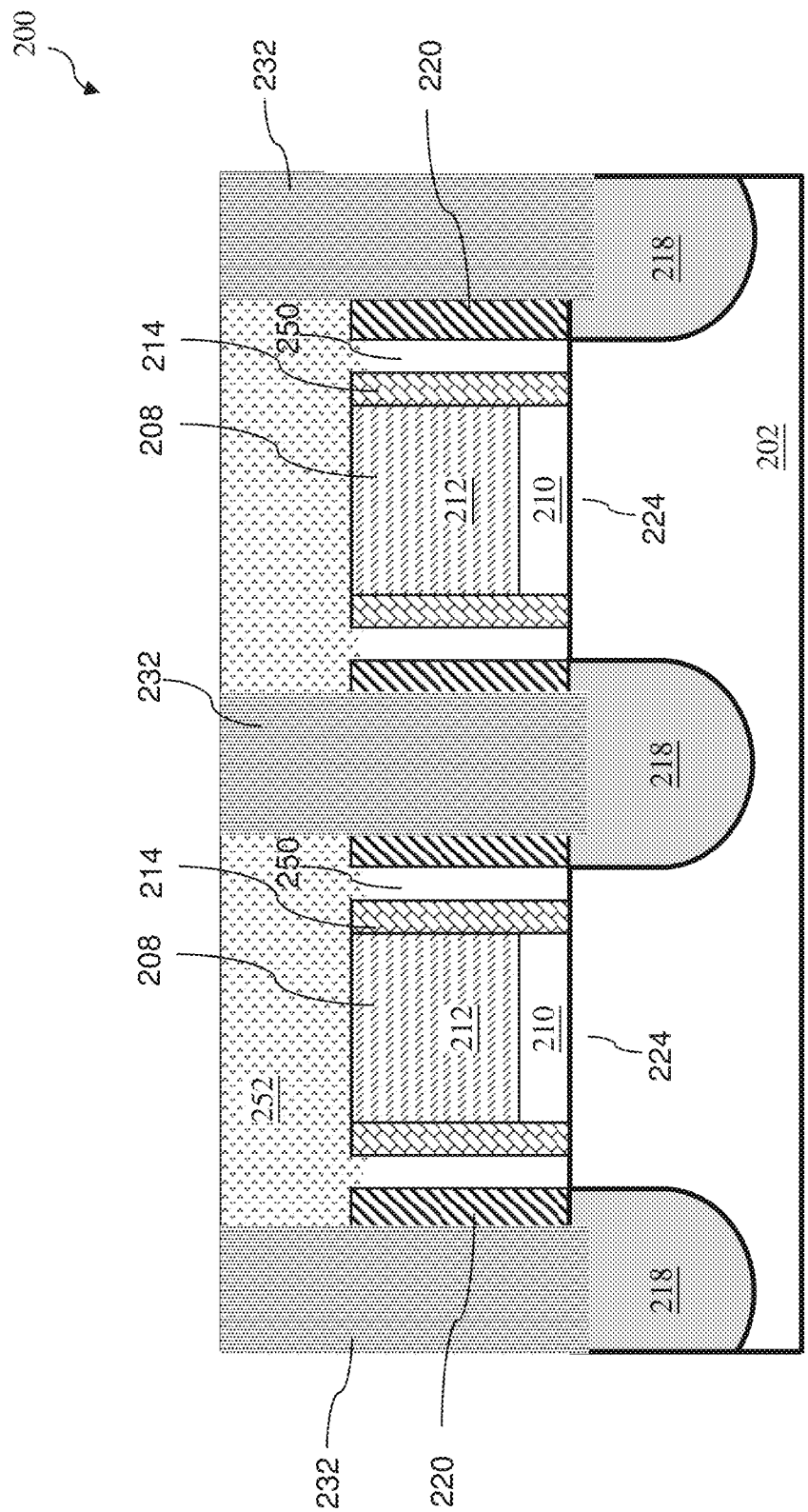

At operation 120, the method 100 (FIG. 1) performs another CMP process to polish the ILD layer 252 and expose the S/D contacts 232 (FIG. 9). Although not shown in FIG. 1, the method 100 may proceed to further processes in order to complete the fabrication of the device 200. For example, the method 100 may form multi-layer interconnect structure that connects the gate stacks 208 and the S/D contacts 232 with other parts of the device 200 to form a complete IC.

Although not intended to be limiting, one or more embodiments of the present disclosure provide many benefits to a semiconductor device and the formation thereof, including fin-type field effect transistors (FinFETs). For example, the fins may be patterned to produce a relatively close spacing between features, for which the above disclosure is well suited. Spacers used in forming fins of FinFETs can be processed according to the above disclosure. For example, embodiments of the present disclosure provide a method of forming air-spacers surrounding the gate stack.

The relative permittivity (or dielectric constant) between the gate stack and source/drain contacts is lower, which reduces interference, noise, and parasitic coupling capacitance between interconnects. Further, the disclosed methods can be easily integrated into existing semiconductor manufacturing processes.

In one exemplary aspect, the present disclosure is directed to a method. The method includes forming a gate structure on a substrate; forming a seal spacer covering a sidewall of the gate structure; forming a sacrificial spacer covering a sidewall of the seal spacer; forming source/drain (S/D) regions sandwiching a channel region that is under the gate structure; depositing a contact etch stop (CES) layer covering a sidewall of the sacrificial spacer; removing the sacrificial spacer to form a trench, wherein the trench spans between a sidewall of the CES layer and the sidewall of the seal spacer; and depositing an inter-layer dielectric (ILD) layer, wherein the ILD layer caps the trench, thereby defining an air gap inside the trench.

In another exemplary aspect, the present disclosure is directed to a method of forming a semiconductor device. The method includes forming a gate stack on a semiconductor substrate; forming a seal spacer covering a sidewall of the gate stack; forming a sacrificial spacer covering a sidewall of the seal spacer; forming source/drain (S/D) regions sandwiching a channel region that is under the gate stack; forming a contact etch stop (CES) layer covering a sidewall of the sacrificial spacer; depositing a first inter-layer dielectric (ILD) layer over the gate stack; patterning the first ILD layer, thereby forming an opening exposing one of the S/D regions; forming an S/D contact in the opening; after the forming of the S/D contact, removing the sacrificial spacer to form a trench, wherein the trench exposes a sidewall of the CES layer and the sidewall of the seal spacer; and depositing a second ILD layer over the S/D contact, the seal spacer, and the gate stack, wherein the second ILD layer seals the trench, thereby defining a void inside the trench.

In another exemplary aspect, the present disclosure is directed to a semiconductor device. The semiconductor device includes a substrate having source/drain (S/D) regions with a channel region interposed therebetween; a gate stack over the channel region; a spacer layer covering sidewalls of the gate stack; an S/D contact over one of the S/D regions; a contact etch stop (CES) layer covering sidewalls of the S/D contact; and an inter-layer dielectric (ILD) layer covering the CES layer, the spacer layer, and the gate stack, wherein the CES layer and the spacer layer are spaced from each other, defining a gap therebetween, the gap being capped by the ILD layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
two source/drain (S/D) regions over a substrate;
a gate stack over the substrate and between the two S/D regions, the gate stack having a gate dielectric layer and a gate electrode layer over the gate dielectric layer;
a spacer layer covering sidewalls of the gate stack;
an S/D contact metal over one of the two S/D regions;
a first dielectric layer covering sidewalls of the S/D contact metal and an upper surface of the two S/D regions; and
a second dielectric layer covering the first dielectric layer, the spacer layer, and the gate stack, and defining an air gap, wherein an extent of a first sidewall of the air gap from a bottommost point to an uppermost point is a sidewall of the first dielectric layer, a second sidewall of the air gap is a sidewall of the spacer layer, a top surface of the air gap defines the uppermost point and is a bottom surface of the second dielectric layer, wherein a material of the first sidewall of the air gap is different from material of the top surface of the air gap, and a material of the second sidewall of the air gap is different from the material of the top surface of the air gap, wherein a top surface of the first dielectric layer and a top surface of the gate electrode layer are coplanar, and a top surface of the S/D contact metal is above the top surface of the gate electrode layer and the top surface of the first dielectric layer.

2. The semiconductor device of claim 1, wherein the top surface of the air gap is defined by silicon oxide, silicon nitride, silicon oxynitride, or silicon carbonitride.

3. The semiconductor device of claim 2, wherein an extent of the second sidewall of the air gap includes one of silicon oxide, aluminum oxide, silicon nitride, silicon oxynitride, silicon carbonitride, or silicon carbon oxynitride.

4. The semiconductor device of claim 3, wherein the first sidewall of the air gap includes another one of silicon oxide, aluminum oxide, silicon nitride, silicon oxynitride, silicon carbonitride, or silicon carbon oxynitride.

5. The semiconductor device of claim 1, wherein a bottom surface of the air gap is a surface of the substrate and defines the bottommost point of the air gap.

6. The semiconductor device of claim 1, wherein the gate stack is disposed over a semiconductor fin of the substrate.

7. The semiconductor device of claim 1, wherein a bottom surface of the air gap is defined by a dielectric material and defines the bottommost point of the air gap.

8. The semiconductor device of claim 7, wherein the dielectric material is a residue comprising at least one of silicon oxide ($SiO_2$), aluminum oxide (AlO), silicon nitride (SiN), silicon oxynitride (SiON), silicon carbonitride (SiCN), or silicon carbon oxynitride (SiCON).

9. A semiconductor device, comprising:
two source/drain (S/D) regions over a substrate;
a gate stack over the substrate and between the two S/D regions, wherein the gate stack includes a gate dielectric layer and a gate electrode layer;
a spacer layer along sidewalls of the gate stack;
an S/D contact metal disposed over and electrically connected to one of the two S/D regions;
a first dielectric layer interposing the S/D contact metal and the gate stack; and
a second dielectric layer over the first dielectric layer, the spacer layer, and the gate stack, thereby defining a gap, wherein the gap includes air, the gap defined by a first sidewall, a second sidewall opposing the first sidewall, an upper surface and a lower surface, wherein a material of the first sidewall of the gap is different from materials of the upper surface and the lower surface of the gap, and a material of the second sidewall of the gap is different from the materials of the upper surface and the lower surface of the gap, and wherein the lower surface of the gap is coplanar with or higher than an uppermost surface of each of the two S/D regions.

10. The semiconductor device of claim 9, wherein each of the first sidewall and the second sidewall of the gap includes at least one of silicon oxide, silicon nitride, silicon oxynitride, or silicon carbonitride.

11. The semiconductor device of claim 9, wherein an uppermost surface of the S/D contact metal is above an uppermost surface of the gate electrode layer.

12. The semiconductor device of claim 11, wherein an uppermost surface of the first dielectric layer and the uppermost surface of the gate electrode layer are coplanar.

13. The semiconductor device of claim 9, wherein the first sidewall of the gap and the second sidewall of the gap include different materials.

14. The semiconductor device of claim 9, wherein a bottommost surface of the S/D contact metal is below a bottommost surface of the gate dielectric layer.

15. A semiconductor device, comprising:
two source/drain (S/D) regions over a substrate;
a gate stack over the substrate and between the two S/D regions in a first direction parallel a top surface of the substrate;
a spacer layer over sidewalls of the gate stack and having an upper surface substantially coplanar with an upper surface of the gate stack;
an S/D contact metal disposed over and electrically connected to one of the two S/D regions;
a first dielectric layer interfacing sidewalls of the S/D contact metal, wherein the first dielectric layer has a first sidewall extending in a direction different than the first direction, the first sidewall aligned with an edge of one of the two S/D regions; and
a gap extending, in the first direction, from the first sidewall of the first dielectric layer to a sidewall of the spacer layer, the sidewall of the spacer layer extending in a direction different than the first direction, wherein a bottom surface of the gap includes a different material than spacer layer and the first dielectric layer, and wherein the gap includes air extending from the first dielectric layer to the spacer layer.

16. The semiconductor device of claim 15, wherein the bottom surface of the gap includes silicon oxide (SiO$_2$), aluminum oxide (AlO), silicon nitride (SiN), silicon oxynitride (SiON), silicon carbonitride (SiCN), or silicon carbon oxynitride (SiCON).

17. The semiconductor device of claim 16, wherein the bottom surface of the gap is curvilinear.

18. The semiconductor device of claim 15, wherein the bottom surface of the gap is the substrate.

19. The semiconductor device of claim 15, wherein the spacer layer and the first dielectric layer comprise different materials, and wherein the gap extends in the first direction between the first sidewall of the first dielectric layer of one material to a sidewall of the spacer layer of another material.

20. The semiconductor device of claim 15, wherein the gap is an air gap having air interfacing the bottom surface of the gap including the different material.

* * * * *